United States Patent [19]

Manriquez

[11] 4,427,332
[45] Jan. 24, 1984

[54] INTEGRATED CIRCUIT WAFER TRANSPORT MECHANISM

[75] Inventor: Ralph F. Manriquez, Saratoga, Calif.

[73] Assignee: Nanometrics, Incorporated, Sunnyvale, Calif.

[21] Appl. No.: 352,752

[22] Filed: Feb. 26, 1982

[51] Int. Cl.³ .................... G01N 21/01; G01N 35/00
[52] U.S. Cl. ............................ 414/331; 211/41;
269/56; 269/229; 269/903; 350/530; 414/268;
414/609; 414/750
[58] Field of Search ............... 211/41; 312/91, 306;
269/56, 229, 233, 903; 350/529, 530, 531;
414/305, 331, 416, 750, 267, 268, 592, 609;
118/236, 500, 719, 729, 731, 733, 724

[56] References Cited

U.S. PATENT DOCUMENTS

| | | | |
|---|---|---|---|
| 3,516,386 | 6/1970 | Landwehr et al. | 118/721 |
| 3,902,615 | 9/1975 | Levy et al. | 414/416 X |
| 4,030,622 | 6/1977 | Brooks et al. | 414/267 X |
| 4,203,696 | 5/1980 | Lindberg | 414/609 X |

*Primary Examiner*—Robert J. Spar
*Assistant Examiner*—Janice Krizek
*Attorney, Agent, or Firm*—Linval B. Castle

[57] ABSTRACT

A manually operable mechanism for attachment to the adjustable stage of an inspection microscope for lifting a selected printed circuit wafer from its slot in a conventional disc holder and positioning it under the microscope lens for inspection. After inspection the mechanism is operated to lift the wafer from its inspection position, to transport it back into the disc holder, and carefully lower it into its correct slot. There is no manual handling of the wafers and therefore the normal losses resulting from breakage and contamination is eliminated.

11 Claims, 14 Drawing Figures

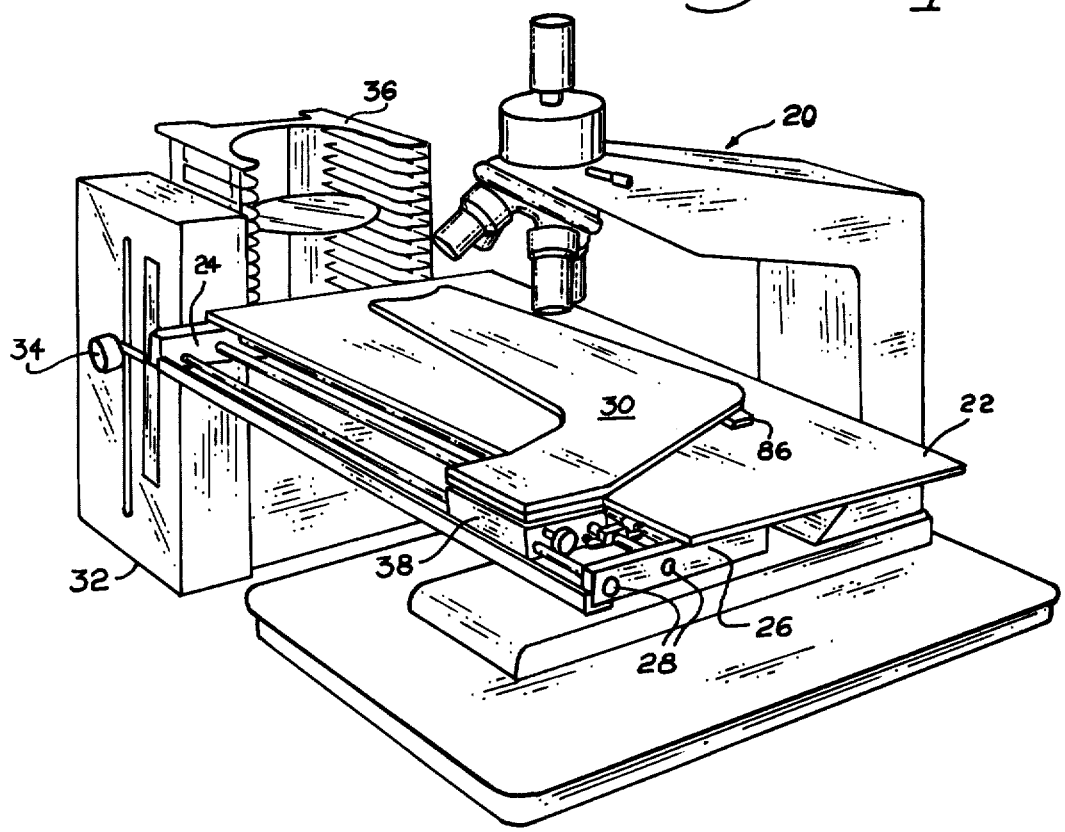
FIG-1-
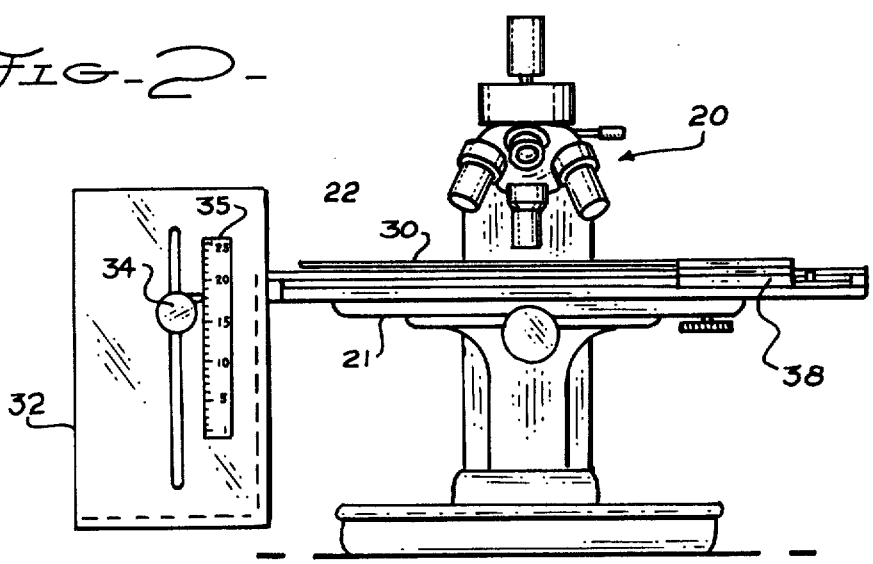
FIG-2-

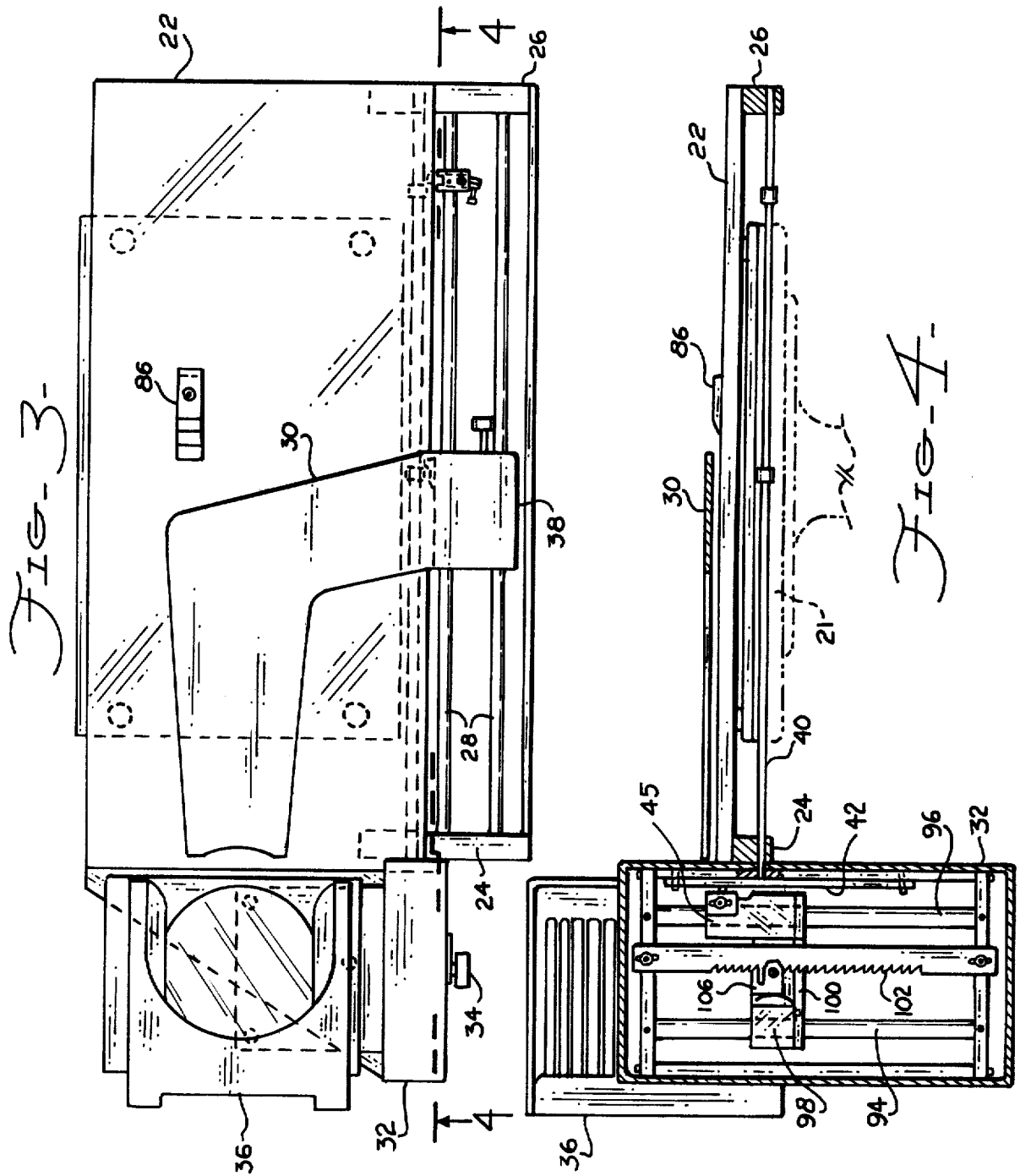

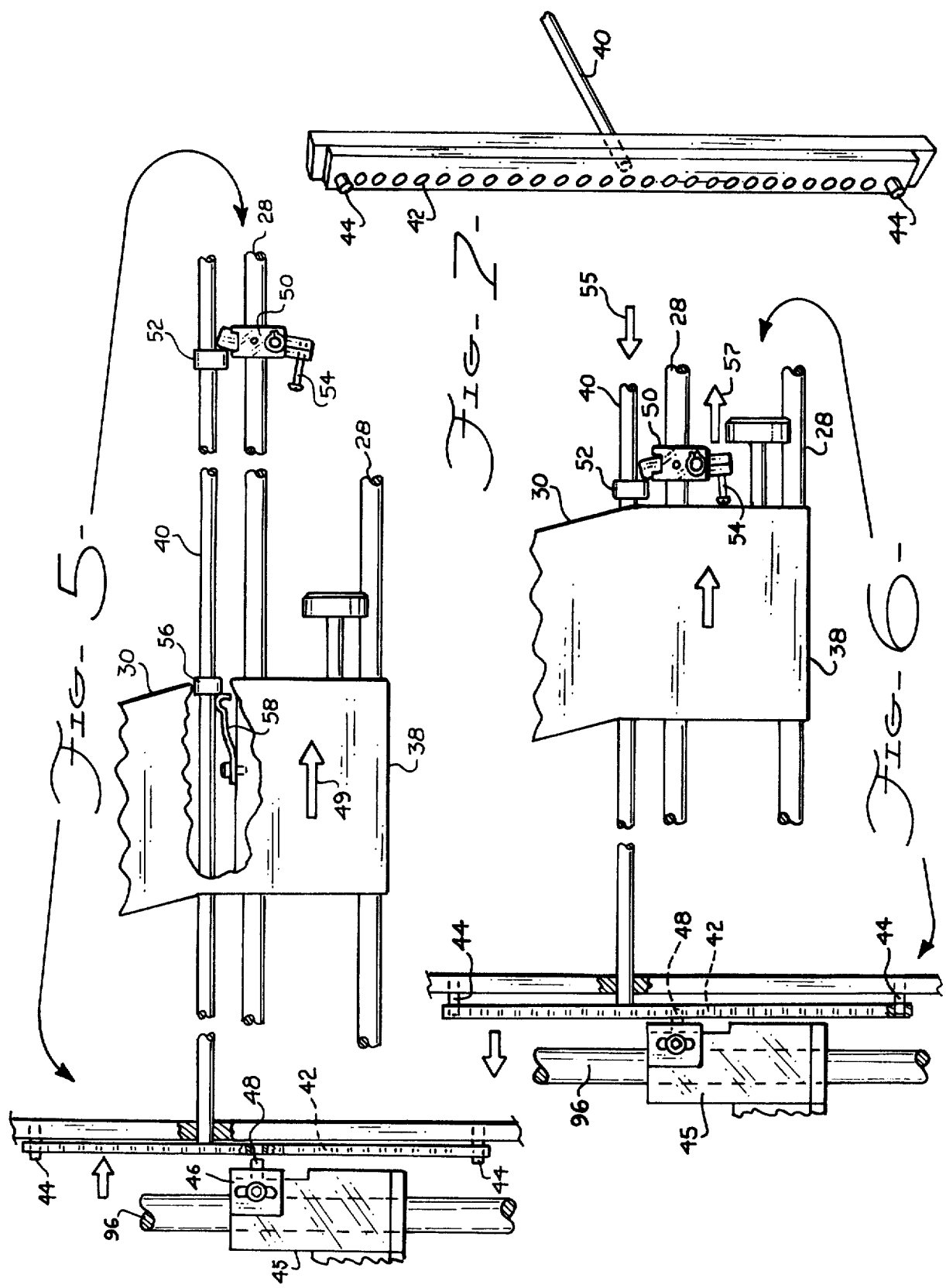

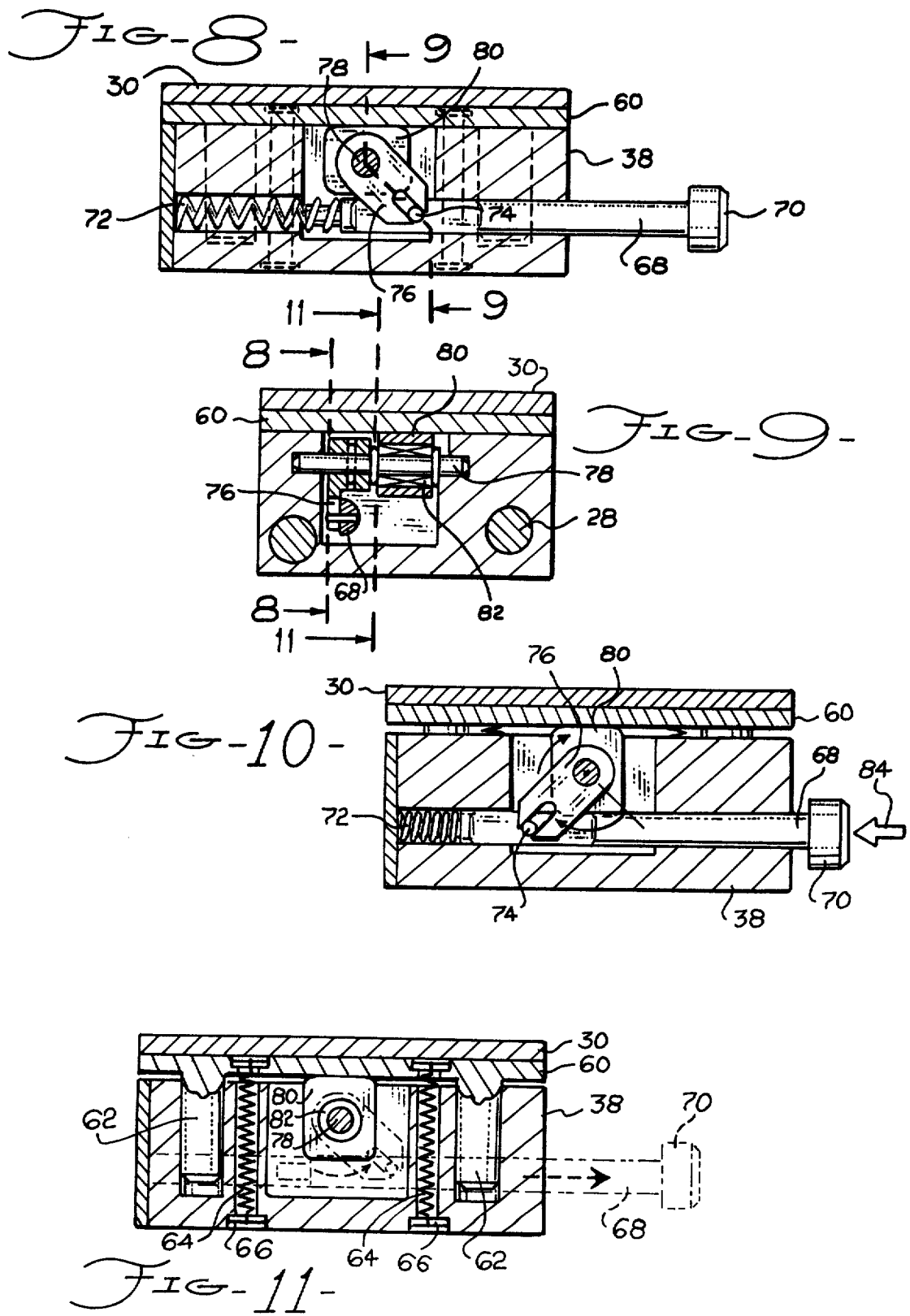

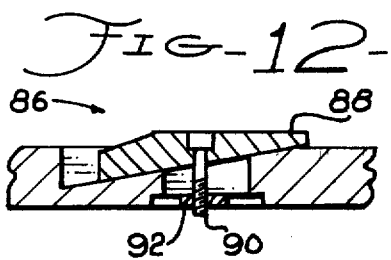
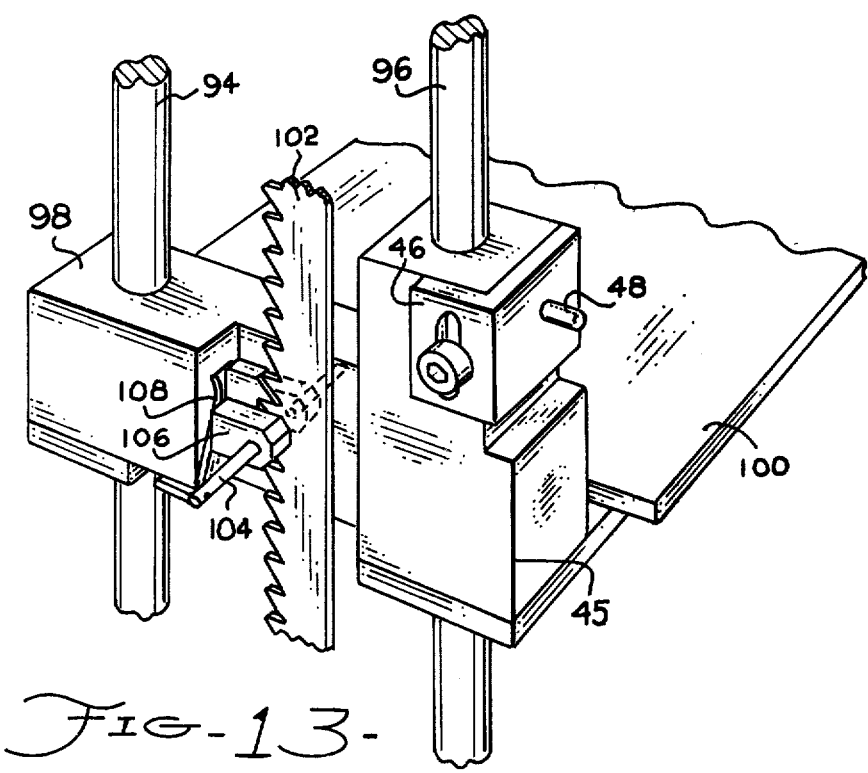
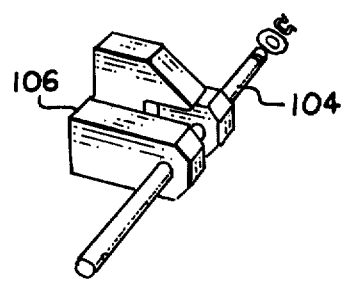

INTEGRATED CIRCUIT WAFER TRANSPORT MECHANISM

This invention relates to integrated circuit production equipment and particularly to a novel mechanism which may be manually operated to transfer circuit wafers between their disc holder and an inspection microscope without human contact and consequent contamination and/or breakage of the wafer.

BACKGROUND OF THE INVENTION

At the present stage of circuit production, integrated circuit chips are manufactured by a photographic reduction process that includes the deposition and etching of extremely thin conductive and semi-conductor materials in a plurality of microscopic patterns on a thin wafer or disc of silicon. Such silicon wafers are generally formed with standard diameters of three, four or five inches and each may contain several hundred individual and identical printed or integrated circuits to be cut apart, bonded and sealted in the final packages.

It is a standard quality control step to inspect each of the many microscopic circuits deposited on each silicon wafer prior to the cutting and packaging of the chips. The normal process for such inspection is to manually position a printed silicon wafer on the adjustable XY stage of an inspection microscope and, after the inspector has completed the examination of each individual circuit and has marked all that were defective, the wafer is manually returned to the disc holder for further processing, including the cutting, packaging and final electronic testing.

Unfortunately, there are substantial losses to both individual circuits and the entire circuit wafer caused by a manual handling of the wafer in the optical inspection step. After the silicon discs or wafers are printed with the large quantity of individual circuits, they are loaded into conventional disc holders which normally carry a stack of approximately twenty-five wafers separated and supported at their edges. Each disc carrier is moved to an optical inspection station where an inspector manually removes one wafer at a time for its microscopic examination and then manually transfers the inspected wafer back to the disc carrier.

Prior to their final packaging, the microscopic circuits are extremely vulnerable to contamination and the large, very thin silicon wafers are easily fractured or broken if mishandled. The microscopic inspection site may be located in a dustproof clean room and the inspection personnel may be properly masked and gloved to minimize the dangers of contamination. However, gloves greatly increase the possibility of mishandling a wafer and many wafers, each carrying a great many individual circuits, are scratched, dropped, contaminated, or broken in the process of moving them from the disc holders to the microscope stage and then from the stage back into the disc holders.

The present invention is for a transfer mechanism which transfers the wafers between the disc holder and the field of view of the inspection microscope and subsequently back to the disc holder without any manual contact with the wafer, thereby substantially eliminating the possibility of contamination, fracturing, dropping or breaking during the optical inspection process.

BRIEF DESCRIPTION OF THE INVENTION

Briefly described, the transport mechanism includes a flat table to be attached to the adustable stage of an inspection microscope. Attached to the front edge of the table and parallel therewith are a pair of parallel guide rods which slidably support a housing, the top plate of which supports an L-shaped arm having a flat top surface, the arm being sufficiently thin to be interleaved between adjacent printed circuit wafers stacked in a conventional disc holder. The disc holder is inserted in a tower which includes a calibrated elevator that may be raised or lowered for selection of a particular disc. Another lift mechanism within the slidable housing is operated to lift its top plate and L-shaped arm by the small amount necessary to carefully lift and remove a wafer from the disc holder and then, after the arm is removed from the holder, to position the arm so that the wafer is firmly located in the field of view of the inspection microscope. Mechanical interlocks operated by the sliding housing and arm prevent readjustment of the disc holder elevator while the arm is interleaved between the wafers and the holder and while the wafer is in the inspection position.

DESCRIPTION OF THE DRAWINGS

In the drawings which illustrate the preferred embodiment of the invention:

FIG. 1 is a perspective view of the wafer transport mechanism attached to an inspection microscope;

FIG. 2 is a front elevation view of the mechanism illustrated in FIG. 1;

FIG. 3 is a plan view of the wafer transport mechanism;

FIG. 4 is a front elevation view of the mechanism taken along the lines 4—4 of FIG. 3;

FIG. 5 is a sectional plan view illustrating details of the tower elevator interlock;

FIG. 6 is a sectional plan view illustrating the tower elevator interlock in its locked position;

FIG. 7 is a perspective view illustrating the tower elevator locking bar;

FIG. 8 is a sectional elevation view of the arm lifting mechanism in its lowered position;

FIG. 9 is a sectional end elevation view taken along the lines 9—9 of FIG. 8;

FIG. 10 is a sectional side elevation view illustrating the operation of the arm lifting mechanism;

FIG. 11 is a sectional side elevation view taken along the lines 11—11 of FIG. 9;

FIG. 12 is a sectional elevation view illustrating the details of the steadyrest in the table of the transport mechanism;

FIG. 13 is a sectional perspective view illustrating the details of the tower elevator mechanism; and FIG. 14 is a perspective view illustrating the details of the latch in the elevator illustrated in FIG. 13.

DETAILED DESCRIPTION

FIGS. 1 and 2 are elevation views illustrating a typical inspection microscope 20 having an adjustable stage 21 to which is attached the wafer transport mechanism. The transport mechanism includes a flat rectangular table 22, movable with the microscope stage and having its longitudinal axis parallel with the "X" direction adjustment of the stage or a side-to-side movement in the microscope field of view. Attached to the bottom surface of the table 22 and substantially flush with each end thereof is a pair of rectangular support bars 24 and 26 which extend out from the front edge of the table approximately two inches. A pair of parallel guide rods 28 are connected to each of the bars 24 and 26. Rods 28 are parallel with the front edge of the table 22, preferably coplanar with the top surface of the table, and are spaced approximately 1½ inches as best shown in FIG. 3. The spaced guide rods 28 support a housing 38 which itself supports an L-shaped transport arm 30. The housing 38 may slide along the rods as will be subsequently described in detail.

Attached to the support bar 24 at the end of table 22 is a frame or tower 32 which encloses an elevator platform 100 (FIGS. 4 and 13) that is vertically adjustable by the handle 34 as will be later described. The elevator platform is adapted to vertically support a conventional commercial plastic disc holder 36 which separates and carries approximately 25 printed circuit discs or wafers by their edges in slots in the three inner walls of the holder. With a loaded disc holder on the elevator platform, any one of the 25 wafers may be selected for transport by the arm 30 by the adjustment of the handle 34 and the elevation of the disc holder 36 to the desired position indicated by the index 35, at which point the arm 30 may be inserted immediately beneath, but not in contact with the selected wafer as shown in FIG. 4 and later in greater detail.

When the tower elevator has raised the disc holder 36 to the desired position and the outer end of the transport arm 30 has been inserted into the wafer stack beneath the selected wafer, the entire arm 30 is raised the small amount necessary to carefully contact the lower surface of the selected disc and slightly lift it out of contact with the slot in the disc holder. The lifting mechanism, illustrated in detail in FIGS. 8-11, will be explained later.

The base end of the transport arm 30 is connected to the top surface of a housing 38 having spaced parallel holes adapted for slidable engagement with the pair of guide rods 28 as shown in FIGS. 1, 5 and 6. Thus, lateral movement of the transport arm 30 is accomplished by sliding the housing 38 along the rods 28.

A tower elevator interlock is provided for preventing any vertical adjustment of the elevator while the transport arm 30 is interleaved within the wafer stack or during the inspection of a selected wafer. As shown in FIG. 4, a lock actuating slide rod 40 journalled through holes in the support bars 24 and 26 and parallel with the guide rods 28 extends through the wall of the tower 32 and is attached to a locking bar 42 that is maintained in a vertical position by pins 44 mounted in the side walls of the tower 32 and which slidably engage with holes in the locking bar 42 as illustrated in greater detail in FIG. 7. The bar 42 contains a plurality of holes aligned in a vertical row between the pins 44 and spaced by an amount substantially identical with the spacing of the wafer slots in a disc holder 36.

FIG. 5 is a sectional plan view illustrating the slidable housing 38 on the guide rods 28 and its coupling to the slide rod 40. The left portion of FIG. 5 is a sectional elevation view of that portion of the tower 32 and its vertical apertured locking bar 42 that interacts with the slide rod 40 to provide the elevator interlocking action. A corner member 45 of the tower elevator, shown in FIG. 4 and in detail in FIG. 13, supports a vertically adjustable angle bracket 46 having an indexing pin 48 affixed therein and substantially parallel with the slide rod 40. The outer end of the pin 48 is normally spaced from the face of the vertical locking bar 42. When the slide rod 40 is moved to its extreme right or unlocked position, as shown by arrow 49 in FIG. 5, the indexing pin 48 does not engage any of the holes in the vertical locking bar 42 and the tower elevator is free to be vertically adjusted as desired. However, movement of the slide rod 40 toward the left will cause the indexing pin 48 to engage one of the plurality of holes in the vertical bar 42 as shown in FIG. 6. When the adjustable angle bracket 46 is properly adjusted, the indexing of the pin 48 in any one of the plurality of locking bar holes will permit the outer end of the transfer arm 30 to enter the disc holder 36 midway between the surfaces of adjacent wafers without contacting either wafer.

The operation of the tower elevator interlock is automatic. As shown in FIG. 5, an adjustable pivot 50 is connected to the guide rod 28 adjacent the slide rod 40 and acts against a collar 52 on the rod 40 to move that rod toward the left when the right surface of the housing 38 strikes the head of the adjustment screw 54 on the pivot 50 as shown in FIG. 6. Both the collar 52 and pivot 50 are firmly attached to their respective rods so that the adjustable pivot acts as a right limit stop for the housing 38 and its transport arm 30. The location of the collar 52 and the pivot 50 on the respective rods 40 and 28 is selected to place any of the printed circuit wafers removed from the disc holder by the transfer arm 30 at precisely the same predetermined point near the optical axis and in the field of view of the inspection microscope. Proper adjustment of the screw 54 or its pivot 50 will assure such consistent and precise positioning.

When the side surface of housing 38 strikes the screw 54, pivot 50 will rotate counterclockwise and move the collar 52 and its slide rod 40 toward the left as shown by arrows 55, 57 in FIG. 6. The apertured locking bar 42 in the tower 32 is moved toward the left to engage the index pin 48 to lock the tower elevator and the disc holder in position until the locking bar is subsequently moved to the left.

As shown in FIG. 5, the slide rod 40 supports a second collar 56 that cooperates with a resilient stop member 58 attached to the exterior rear wall of the housing 38. Stop member 58 has a rounded top surface adapted to ride over the collar 56 but with sufficient force against the rod 40 so that the stop member 58 can move the slide rod 40 when it contacts the collar 56 as the housing 38 is moved along the guide rods 28.

In operation, a disc holder is placed on the elevator platform (FIGS. 1 and 2) in the tower 32 and a wafer is selected by adjustment of the selection handle 34 to the desired point on the index scale 35 of FIG. 2. The transport arm and housing 38, initially assumed to be near the right side of the mechanism, is moved toward the left so that the stop member 58, riding over the collar 56, will slide the rod 40 to engage one hole in the locking bar 42 on the index pin 48 to thus lock the elevator. The thin outer end of the transport arm 30 is thus inserted into the wafer stack under the selected wafer but without contacting that wafer or the surface of the lower adjacent wafer. The transport arm 30 is then lifted by a lift mechanism to be described and the arm 30 and housing 38 are moved toward the right. As the stop mechanism 58 rides over its collar 56, the elevator locking bar 42 is temporarily disengaged from pin 48 but is very soon re-engaged when the right surface of the housing 38 strikes the adjustment screw 54 and the pivot 50 toggles against the collar 52 to move the slide rod 40 to the left. At this location the wafer riding on the end surface of the transport arm is accurately positioned in the microscope field of view where it may be lowered to a more sloid base for inspection. When inspection is completed, the transport arm is raised by the lift mechanism to be described, the housing 38 and arm 30 are moved toward the disc holder. Stop member 58 will override the collar 56 and further urge the slide rod 40 and the locking bar 42 into its locked position, and the end of the transport arm 30 will insert the wafer midway into its respective slot without contacting the disc holder. The lift mechanism is then lowered to carefully set the edges of the wafer into the slot and the transport arm, now no longer in contact with the wafer surface, is removed to the point where it is no longer in the disc holder and to where the stop member 58 has again contacted the collar 56 and has moved the rod 40 to the right so that the elevator locking bar 42 is disengaged from the pin 48.

The lift mechanism is contained in the housing 38 and is illustrated in detail in the sectional elevation views of FIGS. 8-11. Housing 38 may be formed of a solid block having lateral holes to receive the guide rods 28. A cavity is formed in the central portion of the housing, opened to the top of the housing, and covered with a plate or roof section 60 to which is attached the base end of the transport arm 30. As shown in FIG. 11, the roof section 60 is coupled to the housing 38 by guide pins 62 normal to the lower surface of the roof and slidable in vertical holes in the housing 38. Tension springs 64 located in vertical holes through the housing 38 and attached between the lower surface of the roof 60 and a recessed pin or ring 66 in the bottom of the housing holes, operate to urge the roof section into contact with the top surface of the apertured block forming the housing 38.

As best illustrated in FIGS. 8 and 10, a longitudinal hole extending through the housing 38 and parallel with the guide rods 28 contains a lift actuator rod 68 having an external button 70 for operation thereof. The end of the rod 68 within the housing 38 engages a compression spring 72 and exerts a force to urge the actuator rod out of the housing. A transverse pin 74 horizontally extending through the rod 68, normal with the longitudinal axis thereof, and within the aperture of the housing engages a slot in the end of a link 76, the opposite end of which is coupled to a shaft 78 journalled between the front and rear walls of the housing aperture as shown in FIG. 9. The shaft 78 is coupled to a rectangular cam 80 through a rotary clutch 82 such as the Type DC roller clutch manufactured by The Torrington Company.

FIG. 8 illustrates the transport arm 30 in its lowered position with the actuator rod 68 in an outward or non-actuation position and with the rectangular cam 80 horizontally positioned and not bearing against the bottom surface of the roof section 60.

FIG. 10 illustrates the transport arm 30 in its raised position. Actuator rod 68 has been pushed in toward the housing 38 as indicated by the arrow 84. The transverse pin 74 has thus rotated the link one quarter turn in a clockwise direction and the rotary clutch 82 has similarly rotated the cam 80 to its vertical position to raise the roof 60 and the transport arm 30 approximately one-eighth of an inch. Upon release, the action of the spring 72 returns actuator rod 82 to its outward or non-actuating position as shown in phantom in FIG. 11. The next inward movement of the rod 68 will rotate the cam another clockwise quarter revolution and back to its horizontal position to thereby lower the transport arm 30.

It should be noted that the transport arm 30 in its lowered position, does not slide across the top surface of the table 22. In its raised position, the transport arm may be approximately 5/16ths of an inch above the top surface of the table. When the transport arm is moved to place a wafer into position in the field of view of the inspection microscope, the transport arm slides into a substantial and sturdy base for observation of the wafer. The solid base is preferably provided by an adjustable steadyrest 86 illustrated in FIGS. 1, 3, 4 and in greater detail in the sectional elevation view of FIG. 12. The steadyrest 86 includes an adjustable support member 88 having a flat horizontal top surface and a slanted lower surface that engages the corresponding slanted slot in the top surface of the table 22 and at a position that is preferably close to the optical axis of the inspection microscope. The tapered support member 88 is held in position by a recessed screw 90 engaging a nut 92 located in a counterbored hole through the table 22. The support member 88 has a top surface substantially parallel to the top surface of the table 22 and its height above the table is easily and readily adjusted by the loosening of the screw 90 and the movement of the member 88 within the slanted aperture of the table. Thus, when the transport arm carries a wafer from the disc holder to the inspection position, the lower surface of the arm will rest on the top surface of the steadyrest 86, thus providing a solid base for the transfer arm and assurance that every wafer to be inspected will be at the identical point and in focus to the microscope optics.

FIG. 13 is a sectional perspective view illustrating the details of the elevator mechanism in the tower 32 shown in FIG. 4. The tower 32 contains a pair of fixed vertical slide rods 94 and 96 which support slidable elevator members 98 and 45 which are connected together to form a firm horizontal base for an elevator platform 100 upon which the disc holder is to be placed. Positioned vertically between the rods 94 and 96 and attached to the base of the tower 32, as shown in FIG. 4, is a sawtooth ratchet member 102, the teeth of which are pitched to correspond to the spacing between adjacent wafers in a disc holder. As shown in FIG. 13, a shaft 104 pivotally supports a latch member 106 having a triangular face adapted to engage the teeth in the ratchet member 102. One end of the shaft 104 engages a horizontal slot in the member connecting the slide members 98 and 45 while the outer end of the shaft 104 supports the knob 34 illustrated in FIGS. 1 and 2. The latch member 106 is illustrated in detail in FIG. 14 and is shown in its working position in FIG. 13. As illustrated in FIG. 13, a leaf spring 108 positioned between the sliding elevator member 98 and the latch member 106 urges the latch member into meshing contact with the teeth of the ratchet member 102. When it is desired to raise the elevator table 100 and its disc holder, it is only necessary to urge the shaft 104 upward so that when released, the latch member will properly mesh with the appropriate tooth of the ratchet member 102. To lower the elevator table 100 it is necessary to move the shaft 104 toward the left or into further engagement with the leaf spring 108 to release the latch from the ratchet teeth.

In the preferred embodiment described herein, all steps are described as being manual operations. If desired, the various steps such as selecting an appropriate printed circuit wafer, inserting the transport arm and lifting the wafer to its inspection station and thereupon lowering the wafer, could readily be accomplished with various types of electrical or pneumatic controls as accessories to the embodiment described. Because accuracy and the absence of manual handling of wafers is the principal objective of the invention, and speed of handling is not a primary factor, the preferred embodiment of the transport mechanism is described as being a manually operated production tool.

What is claimed is:

1. In the production of intergrated electronic circuits, a transport mechanism for transferring circuit wafers between a disc holder and a predetermined point, said transport mechanism comprising:

elevator means for supporting and vertically adjusting the height of the disc holder in steps corresponding to the spacing of adjacent horizontally placed wafers in said disc holder;

guide means linearly extending parallel with, but displaced from a line between said disc holder and the predetermined point;

a housing coupled to and slidably movable along said guide means, said housing having a vertically movable roof member;

lifting means within said housing for moving said roof member between first and second predetermined vertical positions; and a transport arm having its first end attached to the top surface of said housing roof member, the second end of said arm being substantially centered along said line between said disc holder and said predetermined point, said second end being dimensioned for insertion into a disc holder on said elevator means and between adjacent wafers in said disc holder without contacting either of said wafers when said roof member is in its first vertical position, and for lifting the upper one of said adjacent wafers out of contact with said disc holder when said roof member is in its second vertical position, whereby said upper wafer may be transported to said predetermined point by movement of said housing along said guide means.

2. The transport mechanism claimed in claim 1 further including a stop member coupled to said guide means for limiting the movement of said housing along said guide means and for defining the position of said predetermined point.

3. The transport mechanism claimed in claim 2 further including elevator locking means for preventing vertical adjustment of said elevator means while the second end of said transport arm is inserted within said disc holder.

4. The transport mechanism claimed in claim 3 further including a substantially horizontal table having a top surface parallel with said guide means, said table supporting said guide means and said elevator means, said predetermined point being a point on the top surface of said table.

5. The transport mechanism claimed in claim 4 wherein said elevator locking means includes an index pin located on said elevator and a locking bar having a plurality of holes adapted to receive said index pin, said plurality of holes arranged in a vertical row with each hole in said plurality spaced from its adjacent hole by an amount corresponding to the spacing of adjacent wafers in a disc holder, said locking bar being connected to a lock actuating rod slidable through a stationary wall that houses said elevator whereby said locking bar is moved into and out of engagement with said index pin by horizontal movement of said lock actuating rod.

6. The transport mechanism claimed in claim 5 wherein said lock actuating rod is adjacent and parallel with said guide means and wherein said stop member coupled to said guide means includes a pivot member for cooperating with a first collar on said lock actuating rod for moving said rod and its attached locking member into locking engagement with said index pin when said housing is moved against said stop member.

7. The transport mechanism claimed in claim 6 further including a second collar on said lock actuating rod and a resilient stop member connected to said housing adapted to contact said second collar for moving said lock actuating rod in the direction said housing is moved along said guide means.

8. The transport mechanism claimed in claim 7 wherein said guide means includes at least two parallel rods connected to said table and parallel with the front edge of said table, and wherein said elevator means includes a stationary tower assembly coupled to said table and a vertically adjustable elevator platform slidable upon vertical tracks connected to said tower assembly.

9. The transport mechanism claimed in claim 8 further including means for adjusting said elevator platform in steps corresponding to the spacing of adjacent wafers in a disc holder, said means including a rack gear having a plurality of teeth pitched according to said spacing and vertically attached to said stationary tower assembly;

a spring-biased latch attached to said elevator means, said latch having at least one tooth adapted to engage the teeth in said rack; and latch releasing means for disengaging said latch from said rack teeth.

10. The transport mechanism claimed in claim 9 further including a vertically adjustable horizontal steadyrest within said table and extending from the top surface thereof at a point near said predetermined point, said steadyrest providing a surface of a selected height above said table surface upon which the second end of said transport arm may be positioned.

11. The transport mechanism claimed in claim 10 wherein said table is adapted to be attached to the adjustable stage of an optical inspection microscope, wherein said predetermined point on the surface of said table is substantially on the optical axis of said microscope, and wherein said steadyrest positions said second end of said arm so that the surface of the wafer carried by said second end will be substantially at the point of focus of said microscope.

* * * * *